US011532506B2

(12) United States Patent
Tsai

(10) Patent No.: US 11,532,506 B2
(45) Date of Patent: Dec. 20, 2022

(54) INTEGRATED CIRCUIT STRUCTURE

(71) Applicant: NANYA TECHNOLOGY CORPORATION, New Taipei (TW)

(72) Inventor: Hung-Chi Tsai, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/520,969

(22) Filed: Nov. 8, 2021

(65) Prior Publication Data

US 2022/0059400 A1 Feb. 24, 2022

Related U.S. Application Data

(62) Division of application No. 16/930,913, filed on Jul. 16, 2020, now Pat. No. 11,251,074.

(51) Int. Cl.
*H01L 21/768* (2006.01)
*H01L 23/48* (2006.01)
*H01L 23/532* (2006.01)

(52) U.S. Cl.
CPC .... *H01L 21/7682* (2013.01); *H01L 21/76828* (2013.01); *H01L 21/76886* (2013.01);
(Continued)

(58) Field of Classification Search
CPC ..... H01L 23/48; H01L 23/481; H01L 23/522; H01L 23/532; H01L 23/5222; H01L 23/5329; H01L 23/53295; H01L 21/762; H01L 21/764; H01L 21/768; H01L 21/7682; H01L 21/76828; H01L 21/76886; H01L 21/76898; H01L 21/76888; H01L 21/76885; H01L 21/6224; H01L 29/417; H01L 29/41725; H01L 21/8238; H01L 21/823814; H01L 21/823821; H01L 21/823871; H01L 21/383878
(Continued)

(56) References Cited

U.S. PATENT DOCUMENTS 10,388,747 B1* 8/2019 Xie ............... H01L 21/7682
2018/0097059 A1* 4/2018 Bi ................. H01L 29/401
2020/0152760 A1 5/2020 Cheng et al.

FOREIGN PATENT DOCUMENTS

TW 201806120 A 2/2018
TW 201816856 A 5/2018

OTHER PUBLICATIONS

Office Action dated Jan. 25, 2022 related to Taiwanese Application No. 110119877.

* cited by examiner

Primary Examiner — Chuong A Luu
(74) Attorney, Agent, or Firm — Xuan Zhang

(57) ABSTRACT

The present disclosure provides an integrated circuit structure with dielectric isolation structure for reducing capacitive coupling and crosstalk between conductive features and a method for preparing the same. The integrated circuit structure includes a plurality of conductive structures disposed over a substrate; a plurality of dielectric structures disposed over the conductive structures; an inter-layer dielectric (ILD) layer disposed over sidewalls of the dielectric structures and sidewalls of the conductive structures, wherein the ILD layer, the dielectric structure and the conductive structure form an air spacer therebetween; and a dielectric isolation structure including a liner layer enclosing an air gap in the ILD layer.

6 Claims, 11 Drawing Sheets

(52) U.S. Cl.
CPC ...... *H01L 21/76898* (2013.01); *H01L 23/481* (2013.01); *H01L 23/5329* (2013.01)

(58) Field of Classification Search
USPC ........................................................ 257/773
See application file for complete search history.

INTEGRATED CIRCUIT STRUCTURE

CROSS-REFERENCE TO RELATED APPLICATION

This application is a divisional application of U.S. Non-Provisional application Ser. No. 16/930,913 filed on Jul. 16, 2020, which is incorporated herein by reference in its entirety.

TECHNICAL FIELD

The present disclosure relates to an integrated circuit structure with dielectric isolation structure for reducing capacitive coupling and crosstalk between conductive features.

DISCUSSION OF THE BACKGROUND

Integrated circuit structures are essential for many modern applications. With the advancement of electronic technology, integrated circuit structures are becoming smaller in size while having greater functionality and greater amounts of integrated circuitry. Due to the miniaturized scale of integrated circuit structures, various types and dimensions of integrated circuit structures performing different functionalities are integrated and packaged into a single module. Furthermore, numerous manufacturing operations are implemented for integration of various types of integrated circuit structures.

However, the manufacturing and integration of integrated circuit structures involve many complicated steps and operations. Integration in integrated circuit structures is becoming increasingly complicated. An increase in complexity of manufacturing and integration of the integrated circuit structure may cause deficiencies, such as signal interference between conductive elements. Accordingly, there is a continuous need to improve the manufacturing process of integrated circuit structures so that the deficiencies can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In some embodiments of the present disclosure, a method for preparing an integrated circuit structure is provided. The method for preparing an integrated circuit structure, comprises: forming a first conductive structure over a substrate; forming a first dielectric structure over the first conductive structure; transforming a sidewall portion of the first conductive structure into a first dielectric portion; removing the first dielectric portion such that a width of the first dielectric structure is greater than a width of a remaining portion of the first conductive structure; forming an inter-layer dielectric (ILD) layer covering a sidewall of the first dielectric structure; forming a reinforcement pillar of energy removable material in the ILD layer; forming a capping dielectric layer over the reinforcement pillar; and performing a thermal process to transform the reinforcement pillar into a dielectric isolation structure including a liner layer enclosing an air gap.

In some embodiments, the step of transforming the sidewall portion of the first conductive structure further comprises: performing a heat treatment process on the first conductive structure to form the first dielectric portion over opposite sidewalls of the remaining portion of the first conductive structure, wherein a material of the first dielectric portion is different from a material of the first dielectric structure.

In some embodiments, the heat treatment process is an oxidation process or a nitridation process, and the first dielectric portion is covered by the first dielectric structure.

In some embodiments, the method for preparing an integrated circuit structure further comprises: forming an inter-layer dielectric (ILD) layer covering a sidewall of the first dielectric structure such that a first air spacer is formed between the ILD layer and the remaining portion of the first conductive structure.

In some embodiments, a bottom surface of the first air spacer is higher than a bottom surface of the remaining portion of the first conductive structure.

In some embodiments, the ILD layer extends over and makes direct contact with a lower sidewall of the remaining portion of the first conductive structure.

In some embodiments, the method for preparing an integrated circuit structure further comprises: forming a second conductive structure over the substrate; forming a second dielectric structure over the second conductive structure; transforming a sidewall portion of the second conductive structure into a second dielectric portion during the formation of the first dielectric portion; and removing the second dielectric portion such that a distance between the remaining portion of the first conductive structure and a remaining portion of the second conductive structure is greater than a distance between the first dielectric structure and the second dielectric structure.

In some embodiments, the method for preparing an integrated circuit structure further comprises: forming an inter-layer dielectric (ILD) layer covering a sidewall of the first dielectric structure such that a first air spacer is formed between the ILD layer and the remaining portion of the first conductive structure.

In some embodiments, a bottom surface of the first air spacer is higher than a bottom surface of the remaining portion of the first conductive structure.

In some embodiments, the ILD layer is formed covering a sidewall of the second dielectric structure such that a second air spacer is formed between the ILD layer and the remaining portion of the second conductive structure, wherein the first spacer and the second spacer are entirely covered by the first dielectric structure and the second dielectric structure, respectively.

In some embodiments of the present disclosure, a method for preparing an integrated circuit structure is provided. The method for preparing an integrated circuit structure, comprises: forming a conductive layer over a substrate; forming a dielectric layer over the conductive layer; patterning the dielectric layer and the conductive layer to form a first dielectric structure, a second dielectric structure, a first conductive structure and a second conductive structure, wherein a first opening is formed between the first dielectric structure and the second dielectric structure, and a second opening is formed between the first conductive structure and the second conductive structure; partially removing the first conductive structure and the second conductive structure to form an enlarged second opening; forming an inter-layer dielectric (ILD) layer covering sidewalls of the first dielectric structure and the second dielectric structure; forming a reinforcement pillar of energy removable material in the ILD layer; forming a capping dielectric layer over the reinforcement pillar; and performing a thermal process to transform the reinforcement pillar into a dielectric isolation structure including a liner layer enclosing an air gap.

In some embodiments, a width of the enlarged second opening is greater than a width of the first opening.

In some embodiments, the method for preparing an integrated circuit structure further comprises: depositing an inter-layer dielectric (ILD) layer in the first opening after the enlarged second opening is formed such that an upper sidewall of the first conductive structure is separated from the ILD layer by a first air spacer.

In some embodiments, an upper sidewall of the second conductive structure is separated from the ILD layer by a second air spacer, and wherein an interface between the first air spacer and the ILD layer is entirely covered by the first dielectric structure, and an interface between the second air spacer and the ILD layer is entirely covered by the second dielectric structure.

In some embodiments, the ILD layer is deposited in the first opening and the enlarged second opening, and the first air spacer is enclosed by the upper sidewall of the first conductive structure, the first dielectric structure and the ILD layer.

In some embodiments, a bottommost surface of the ILD layer is higher than a bottom surface of the first conductive structure.

In some embodiments of the present disclosure, an integrated circuit structure is provided. The integrated circuit structure comprises: a plurality of conductive structures disposed over a substrate; a plurality of dielectric structures disposed over the conductive structures; an inter-layer dielectric (ILD) layer disposed over sidewalls of the dielectric structures and sidewalls of the conductive structures, wherein the ILD layer, the dielectric structure and the conductive structure form an air spacer therebetween; and a dielectric isolation structure including a liner layer enclosing an air gap in the ILD layer.

In some embodiments, a width of the air spacer gradually decreases along a direction from the dielectric structures to the substrate.

In some embodiments, a lower portion of the sidewall of the conductive structure is in direct contact with the ILD layer, In some embodiments, the conductive structure and the air spacer are entirely covered by the dielectric structure, and a portion of a bottom surface of the dielectric structure is in direct contact with the ILD layer.

Embodiments for preparing an integrated circuit structure are provided in accordance with some embodiments of the disclosure. The method for forming the integrated circuit structure includes transforming a sidewall portion of a conductive structure into a dielectric portion, and removing the dielectric portion. As the dielectric portion is removed, a width of a dielectric structure over the conductive structure is greater than a width of a remaining portion of the conductive structure, while the height of the conductive structure keeps the same. In other words, the aspect ratio of the conductive structure becomes higher, i.e., the present disclosure can prepare a high aspect ratio conductive structure, which may serve as conductive vias.

The formation of the air spacers over the sidewalls of the conductive features and the dielectric isolation structure between the conductive features aids in the prevention of crosstalk (i.e., signal interference) between adjacent conductive structures, and the performance of the integrated circuit structures may be improved. Moreover, because the ILD layer is formed over opposite sidewalls of the conductive structures after the conductive structures are formed, a pinch-off problem near the top of the conductive structures and creation of voids or seams in the conductive structures can be prevented. In addition, the method also includes transforms a reinforcement pillar into a dielectric isolation structure including a liner layer enclosing an air gap, which can reduce capacitive coupling and crosstalk between conductive features.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
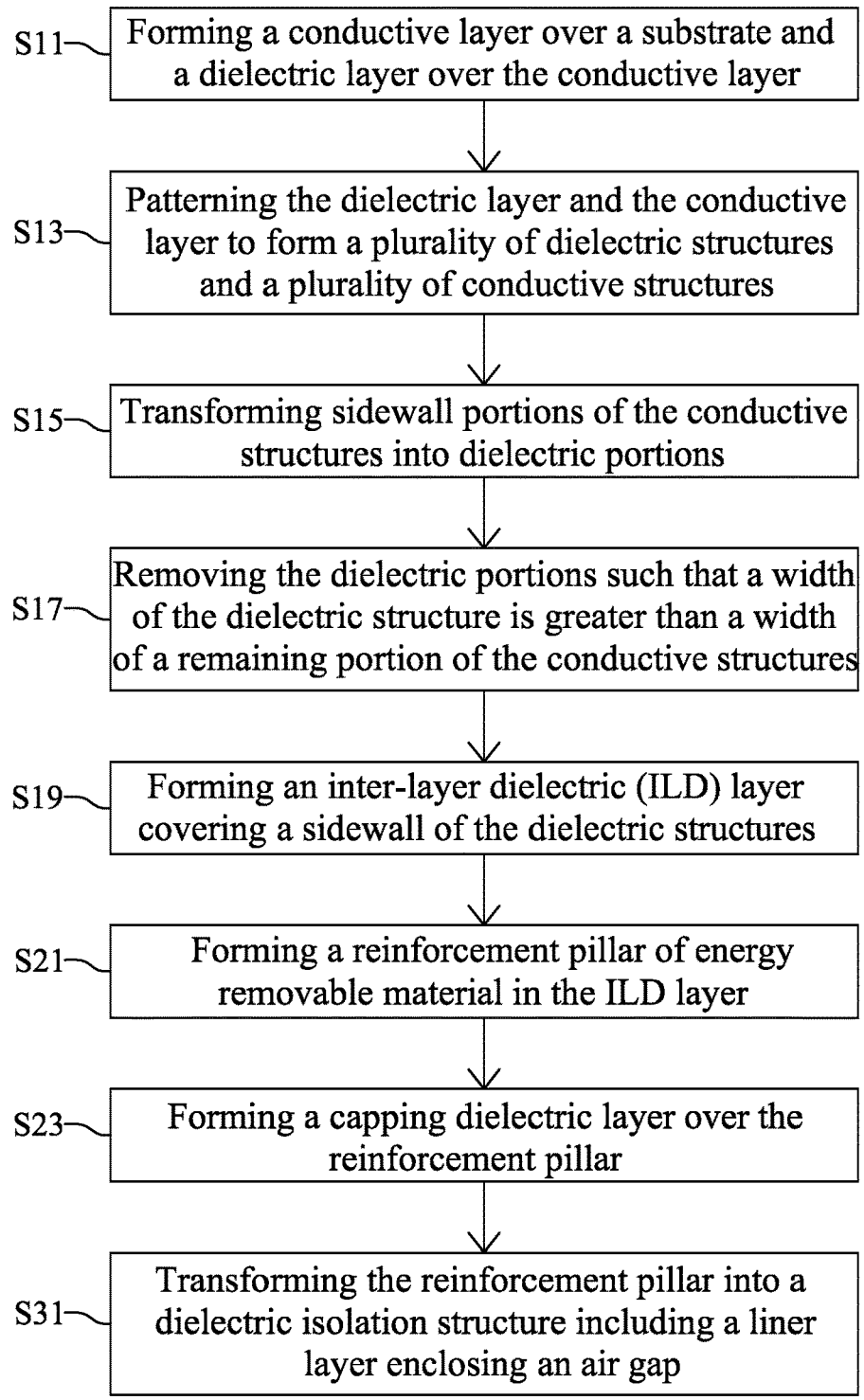
FIG. 1 is a flow diagram illustrating a method of preparing an integrated circuit structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method 10 of preparing an integrated circuit structure, in accordance with some embodiments of the present disclosure. The method 10 includes steps S11, S13, S15, S17, S19, S21, S23, and S25.

The steps S11 to S25 of FIG. 1 are first introduced briefly and then elaborated in connection with FIGS. 2 to 8. The method 10 begins at step S11, fabrication processes such a deposition processes are performed to form a conductive layer over a substrate and a dielectric layer over the conductive layer. In some embodiments, the substrate includes various passive and active microelectronic devices, and the conductive layer is used to form electrical connections between the microelectronic devices and other devices formed over the conductive layer. At step S13, a patterning process is performed to the dielectric layer and the conductive layer to form a plurality of dielectric structures and a plurality of conductive structures. In some embodiments, the patterning process is performed on the dielectric layer and the conductive layer using a mask over the dielectric layer. After the patterning process, sidewalls of the dielectric structures are substantially coplanar with sidewalls of the conductive structures.

At step S15, sidewall portions of the conductive structures are transformed into dielectric portions. In some embodiments, the dielectric portions are formed by performing a heat treatment process.

At step S17, removing the dielectric portions such that a width of the dielectric structure is greater than a width of a remaining portion of the conductive structures. In some embodiments, At step S19, an inter-layer dielectric (ILD) layer is formed covering sidewalls of the dielectric structures. In some embodiments, air spacers are formed between the ILD layer and the remaining portions of the conductive structures.

At step S21, a reinforcement pillar of energy removable material is formed in the ILD layer. At step S23, a capping dielectric layer is formed over the reinforcement pillar. At step 25, the reinforcement pillar is transformed into a dielectric isolation structure including a liner layer enclosing an air gap.

FIGS. 2 to 8 are schematic cross-sectional views illustrating various stages of preparing an integrated circuit structure 100a by the method of FIG. 1 in accordance with some embodiments of the present disclosure.

Figure 2:
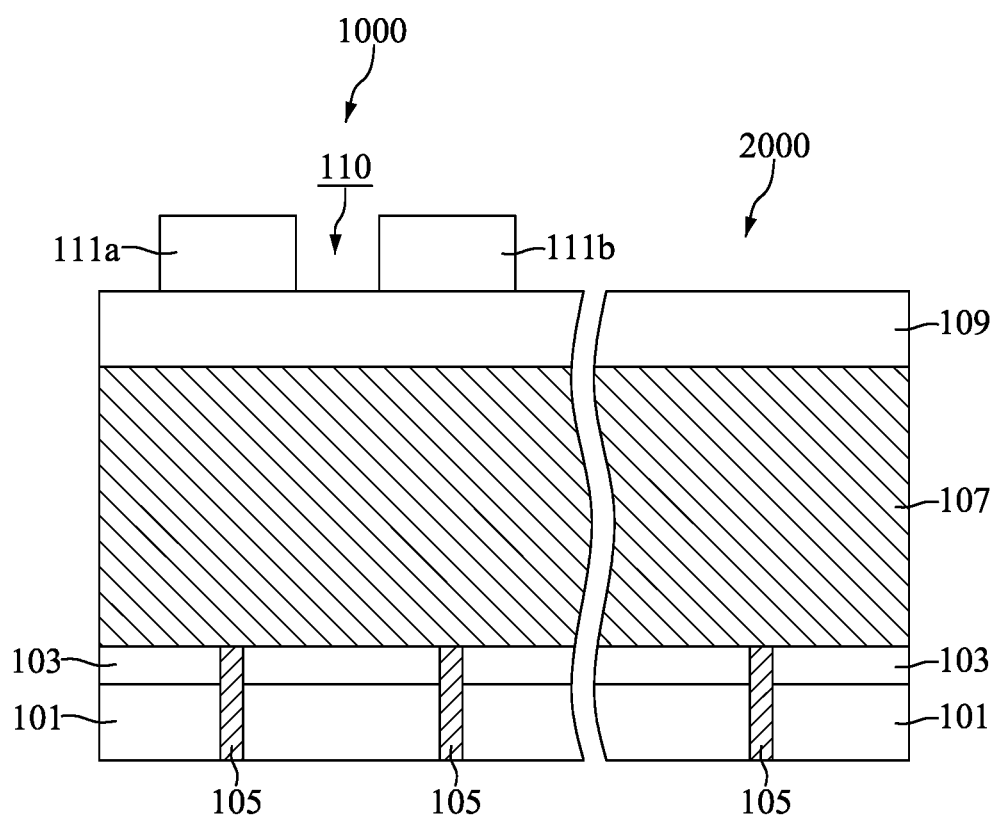
FIGS. 2 to 10 are schematic cross-sectional views illustrating various stages of preparing an integrated circuit structure by the method of FIG. 1 in accordance with some embodiments of the present disclosure.

As shown in FIG. 2, a substrate 101 is provided or received. In some embodiments, the substrate 101 may include a semiconductor substrate such as a silicon substrate. In some embodiments, the substrate 101 includes other elementary semiconductor materials such as germanium (Ge). In some embodiments, the substrate 101 includes a compound semiconductor such as gallium arsenide, gallium phosphide, indium phosphide, indium arsenide, and/or indium antimonide. In some embodiments, the substrate 101 includes an alloy semiconductor such as SiGe, GaAsP, AlInAs, AlGaAs, GaInAs, GaInP, and/or GaInAsP. Alternatively, the substrate 101 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In addition, the substrate 101 may be a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof.

Depending on the IC fabrication stage, the substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). For example, a dielectric layer 103 is formed over the substrate 101 as shown in FIG. 2. In some embodiments, the dielectric layer 103 is made of silicon oxide ($SiO_2$), silicon nitride (SiN), silicon carbide (SiC), silicon oxynitride (SiON), silicon oxycarbide (SiOC), silicon carbonitride (SiCN), silicon oxide carbonitride (SiOCN), another suitable dielectric material, or a combination thereof.

The substrate 101 of FIG. 2 has been simplified for the sake of clarity. It should be noted that additional features can be added in the substrate 101, and some of the features described below can be replaced, modified, or eliminated in other embodiments.

In the depicted embodiment, a plurality of conductive plugs 105 are formed in the substrate 101 and the dielectric layer 103. More specifically, the conductive plugs 105 are formed penetrating through the dielectric layer 103 and the substrate 101. However, in other embodiments, the substrate 101 is not penetrated by the conductive plugs 105. In some embodiments, the conductive plugs 105 are disposed to form electrical connections between the devices in the semiconductor substrate 101 and other devices formed over the dielectric layer 103.

In some embodiments, the conductive plugs 105 are made of copper (Cu), aluminum (Al), silver (Ag), tungsten (W), another conductive material, or a combination thereof, and the conductive plugs 105 are formed by an etching process and a subsequent deposition process. In addition, the conductive plugs 105 may be through-silicon vias or through-substrate vias (TSVs) in accordance with some embodiments.

Moreover, the substrate 101 includes a first region 1000 and a second region 2000. In some embodiments, the pattern density of the first region 1000 of the substrate 100 is greater than the pattern density of the second region 2000. Therefore, in these embodiments, the first region 1000 may be referred to as the pattern-dense region such as the cell region in DRAM, and the second region 2000 may be referred to as the pattern-sparse region such as the peripheral circuit region in DRAM.

Still referring to FIG. 2, the method 10 at step S11 forms a conductive layer 107 over the dielectric layer 103, and forms a dielectric layer 109 over the conductive layer 107. In some embodiments, the conductive layer 107 is made of doped polycrystalline silicon (polysilicon), tungsten (W), aluminum (Al), copper (Cu), another conductive material, or a combination thereof, and the dielectric layer 109 is made of silicon oxide ($SiO_2$), silicon nitride (SiN), silicon carbide (SiC), silicon oxynitride (SiON), silicon oxycarbide (SiOC), silicon carbonitride (SiCN), silicon oxide carbonitride (SiOCN), another applicable dielectric material, or a combination thereof. In addition, the conductive layer 107 and the dielectric layer 109 may be formed by deposition processes, such as chemical vapor deposition (CVD) processes, physical vapor deposition (PVD) processes, atomic layer deposition (ALD) processes, spin-coating processes, sputtering processes, other suitable processes, or combinations thereof.

Because the crosstalk problem (i.e., signal interference) between adjacent conductive features is more serious in the first region 1000 (i.e., the pattern-dense region) than in the second region 2000 (i.e., the pattern-sparse region), the following processes are performed on the first region 1000. However, these are merely examples and are not intended to be limiting. For example, in some other embodiments, the following processes are also performed on the second region 2000.

Figure 3:
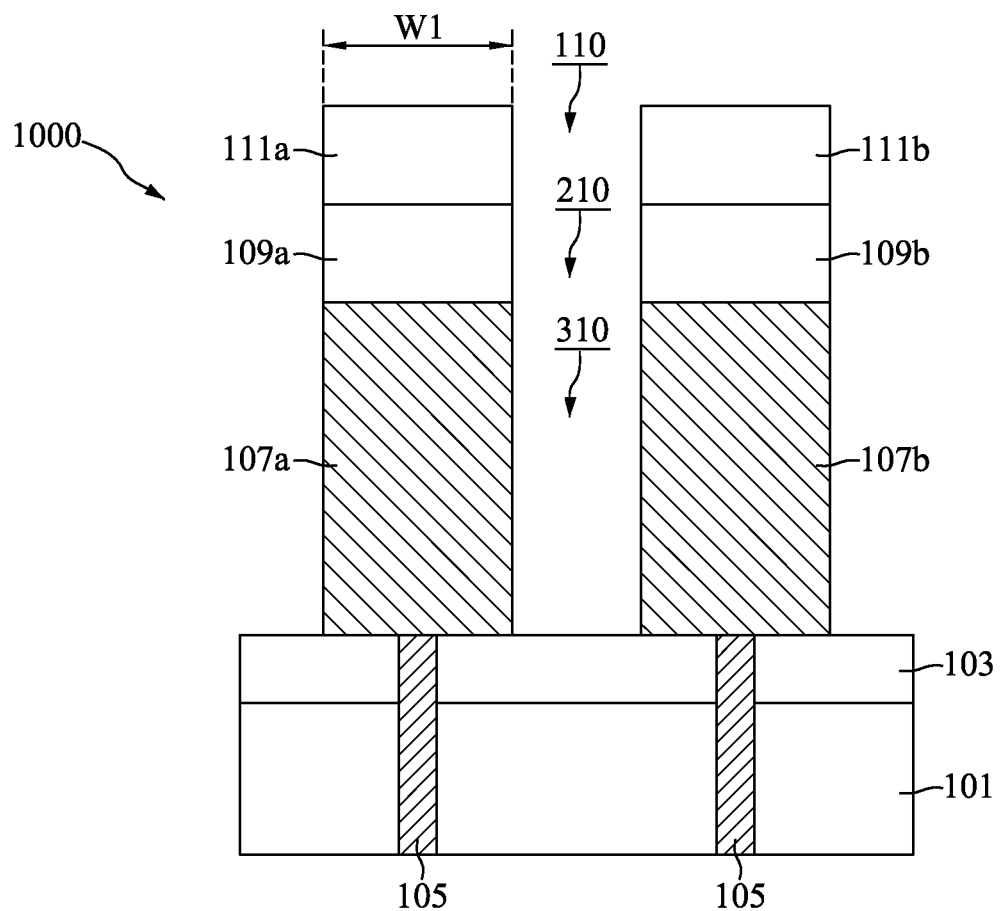

Referring to FIGS. 2 and 3, the method 10 at step S13 performs a patterning process on the dielectric layer 109 and the conductive layer 107. In some embodiments, the patterning process starts by forming a mask including a mask pattern 111a and a mask pattern 111b over the dielectric layer 109, wherein an opening 110 is formed between the mask patterns 111a and 111b, as shown in FIG. 2. The mask patterns 111a and 111b may be formed by depositing a mask layer (not shown) covering the dielectric layer 109. A patterned photoresist layer (not shown) may then be formed over the mask layer.

The patterned photoresist layer may be formed by a deposition process and a patterning process. The deposition process for forming the patterned photoresist layer may include a CVD process, a high-density plasma chemical vapor deposition (HDPCVD) process, a spin-coating process, a sputtering process, or another suitable process. The patterning process for forming the patterned photoresist layer may include a photolithography process and an etching process. The photolithography process may include photoresist coating (e.g., spin coating), soft baking, mask aligning, exposure, post-exposure baking, developing the photoresist, rinsing and drying (e.g., hard baking). The etching process may include dry etching (e.g., reactive-ion etching (RIE)), wet etching and/or other etching methods.

In some embodiments, the mask layer is made of silicon oxide, silicon nitride, silicon oxynitride, or another suitable material, and the mask layer may be formed by a deposition process, which may include a CVD process, an HDPCVD process, a spin-coating process, a sputtering process, or another suitable process. After the patterned photoresist layer is formed, the mask layer is etched using the patterned photoresist layer as a mask. As a result, the mask including the mask patterns 111a and 111b with the opening 110 between them is obtained. The patterned photoresist layer may then be removed.

Next, as shown in FIG. 3, the dielectric layer 109 and the conductive layer 107 are etched using the mask patterns 111a and 111b as an etching mask. As a result, a dielectric structure 109a and a dielectric structure 109b are formed with an opening 210 between them, and a conductive structure 107a and a conductive structure 107b are formed with an opening 310 between them. In some embodiments, the top surface of the dielectric layer 103 is exposed by the opening 310. In some embodiments, the steps S11 and S13 are also performed in the second region 2000 to form the conductive structure 107a over the conductive plug 105 in the second region 2000.

It should be noted that the dielectric layer 109 and the conductive layer 107 are etched using the same mask. Thus, the sidewalls of the conductive structure 107a are substantially coplanar with the sidewalls of the dielectric structure 109a, and the sidewalls of the conductive structure 107b are substantially coplanar with the sidewalls of the dielectric structure 109b, in accordance with some embodiments. Within the context of this disclosure, the word "substantially" means preferably at least 90%, more preferably 95%, even more preferably 98%, and most preferably 99%.

In some embodiments, the top surfaces of the conductive structures 107a and 107b are entirely covered by the dielectric structures 109a and 109b. In some embodiments, as shown in the cross-sectional view of FIG. 3, the width of the dielectric structure 109a and the width of the conductive structure 107a are substantially the same, and are defined as the width W1. Similarly, the width of the dielectric structure 109b and the width of the conductive structure 107b are substantially the same. After the openings 210 and 310 are formed, the mask including the mask patterns 111a and 111b is removed.

Figure 4:
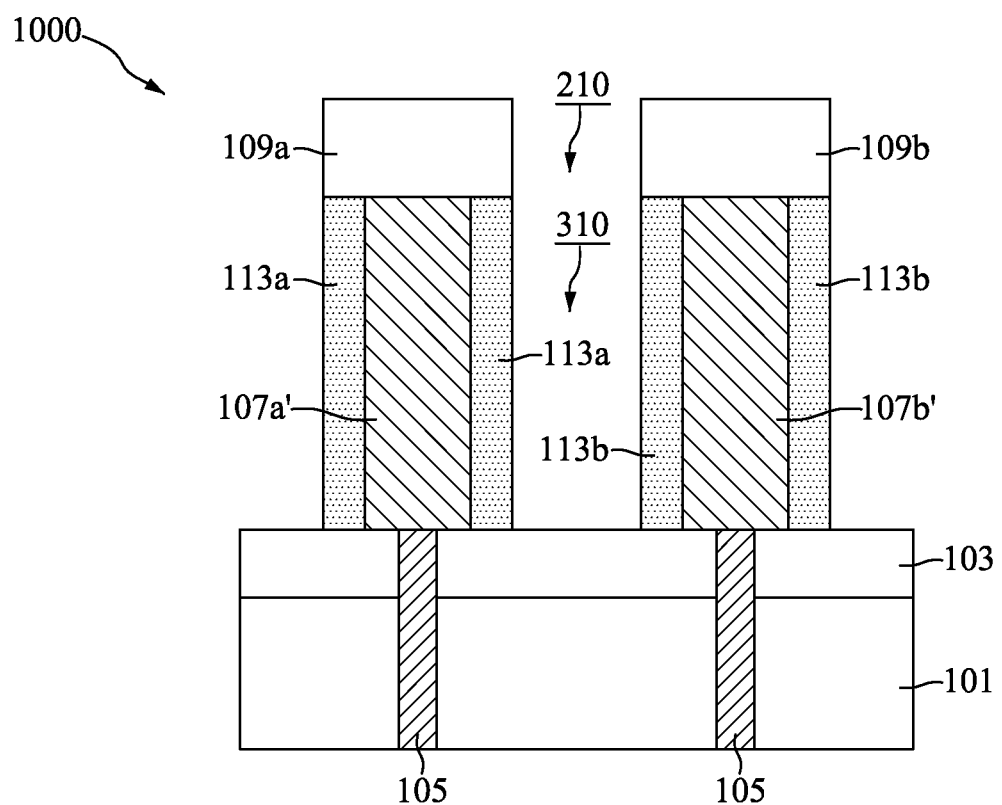

Referring to FIG. 4, the method 10 at step S15 transforms sidewall portions of the conductive structure 107a and sidewall portions of the conductive structure 107b into dielectric portions 113a and 113b. As a result, the dielectric portions 113a are formed over opposite sidewalls of the remaining portion of the conductive structure 107a', and the dielectric portions 113b are formed over opposite sidewalls of the remaining portion of the conductive structure 107b'.

In some embodiments, the dielectric portions 113a are covered by the dielectric structure 109a, and the dielectric portions 113b are covered by the dielectric structure 109b. In some embodiments, the dielectric portions 113a protrude from the sidewalls of the dielectric structure 109a, and the dielectric portions 113b protrude from the sidewalls of the dielectric structure 109b. However, the dielectric portions 113a and 113b are at least partially covered by the dielectric structures 109a and 109b, respectively.

Moreover, in some embodiments, the dielectric portions 113a and 113b are formed by performing a heat treatment process, which includes an oxidation process, a nitridation process, another suitable process or a combination thereof. In order to provide a high etching selectivity during the subsequent etching process, the material of the dielectric portions 113a and 113b should be different from the material of the dielectric structures 109a and 109b. Therefore, the gas applied during the heat treatment process is selected based on the material of the dielectric structures 109a and 109b.

For example, if the dielectric structures 111a and 111b are made of silicon oxide, nitrogen may be diffused into the sidewall surfaces of the conductive structures 107a and 107b during the heat treatment process (i.e., nitridation process), and the dielectric portions 113a and 113b may be made of nitride, such as silicon nitride.

In addition, if the dielectric structures 109a and 109b are made of silicon nitride, oxygen may be diffused into the sidewall surfaces of the conductive structures 107a and 107b during the heat treatment process (i.e., oxidation process), and the dielectric portions 113a and 113b may be made of silicon oxide ($SiO_2$), tungsten oxide (WO), aluminum oxide ($Al_2O_3$), copper oxide (CuO), or a combination thereof, depending on the material of the conductive structures 107a and 107b.

Figure 5:
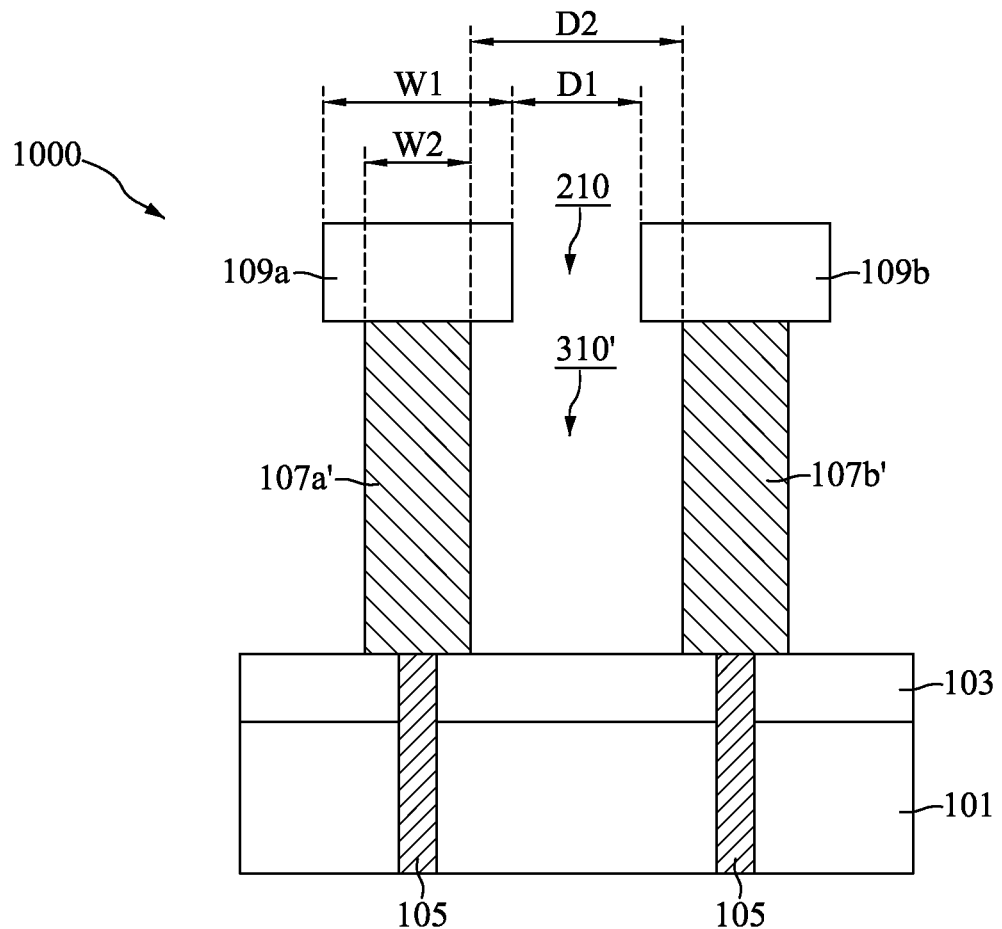

Referring to FIG. 5, the method 10 at step S17 removes the dielectric portions 113a and 113b. In some embodiments, the dielectric portions 113a and 113b are removed by an etching process. The etching process may include dry etching (e.g., RIE), wet etching and/or other etching methods.

In some embodiments, the materials of the dielectric portions 113a, 113b and the dielectric structures 109a, 109b are selected such that the etching selectivities of the dielectric portions 113a, 113b with respect to the dielectric structures 109a, 109b are high. Therefore, the dielectric portions 113a and 113b are removed by the etching process while the dielectric structures 109a and 109b may be substantially left intact.

After the removal of the dielectric portions 113a and 113b, an enlarged opening 310' is obtained. It should be noted that a distance D2 between the remaining portions of the conductive structures 107a' and 107b' (i.e., the width of the enlarged opening 310') is greater than a distance D1 (i.e., the width of the opening 210) between the dielectric structures 109a and 109b, and a width W1 of the dielectric structure 109a is greater than a width W2 of the remaining portion of the conductive structure 107a'. Similarly, a width of the dielectric structure 109b is greater than a width of the remaining portion of the conductive structure 107b'.

Figure 6:
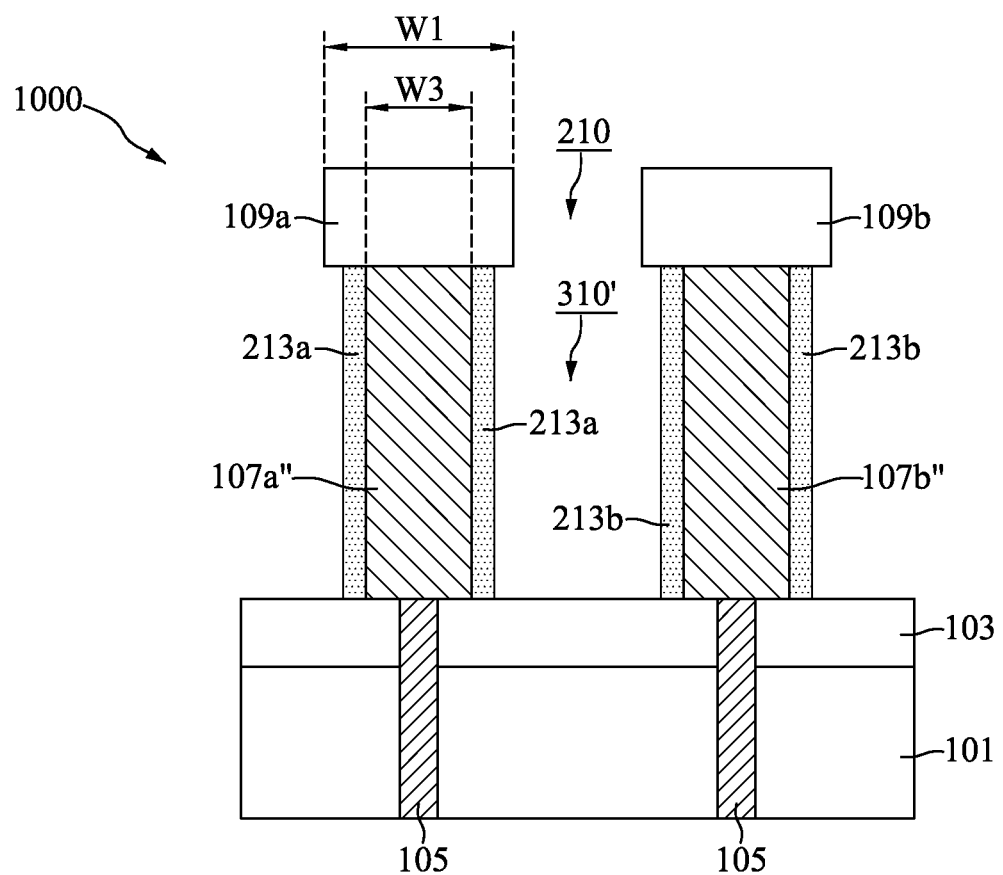

Referring to FIG. 6, after the dielectric portions 113a and 113b are removed, a second heat treatment process may be performed on sidewalls of the remaining portions of the conductive structures 107a' and 107b', in accordance with some embodiments. The second heat treatment process may be optionally performed. For example, in some embodiments, the second heat treatment process can be omitted if the desired widths of the remaining portions of the conductive structures 107a' and 107b' are reached after the dielectric portions 113a and 113b are removed.

Referring to FIG. 6, after the second heat treatment process is performed, sidewall portions of the remaining portions of the conductive structures 107a' and 107b' are transformed into dielectric portions 213a and 213b. As a result, dielectric portions 213a and 213b are formed over sidewalls of the remaining portions of the conductive structures 107a" and 107b", respectively. In some embodiments, a width W3 of the remaining portion of the conductive structure 107a" is less than the width W2 of the remaining portion of the conductive structure 107a' before the second heat treatment process is performed (as shown in FIG. 5), and the width W2 is less than the width W1 of the dielectric structure 109a.

After the second heat treatment process, the dielectric portions 213a and 213b are removed by an etching process in accordance with some embodiments. Next, another heat treatment process may be selectively performed until the desired widths of the remaining portions of the conductive structures 107a" and 107b" are reached.

Figure 7:
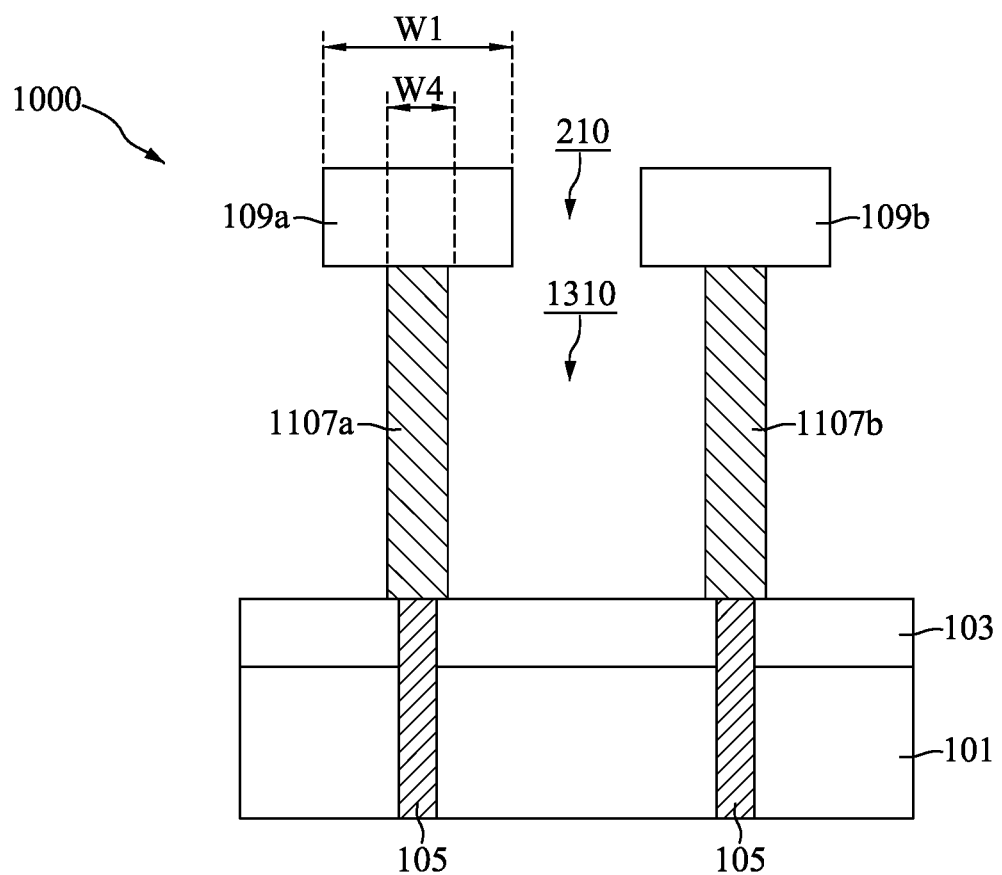

Referring to FIG. 7, remaining portions of the conductive structures 1107a and 1107b are obtained once the desired widths are reached. In some embodiments, the remaining portions of the conductive structures 1107a and 1107b are through-silicon vias or through substrate vias (TSVs). In some embodiments, the remaining portion of the conductive structure 1107a has a width W4, which is less than the width W1 of the dielectric structure 109a. Similarly, a width of the remaining portion of the conductive structure 1107b is less than the width W1 of the dielectric structure 109b.

Moreover, in some embodiments, the remaining portions of the conductive structures 1107a and 1107b are separated by an opening 1310, which is wider than the enlarged opening 310' in FIG. 6. It should be noted that the remaining portions of the conductive structures 1107a and 1107b are entirely covered by the dielectric structures 109a and 109b, respectively, and the conductive plugs 105 are covered by the remaining portions of the conductive structures 1107a and 1107b.

In some embodiments, the steps S15 and S17 are performed in the first region 1000, while the second region 2000 are covered by a hard mask; consequently, the conductive structure 107a over the conductive plug 105 in the second region 2000 are kept the same as that shown in FIG. 3. In other words, the aspect ratio of the conductive structures 1107a and 1107b serving as conductive vias in the first region 1000 is higher than that in the second region 2000.

Figure 8:
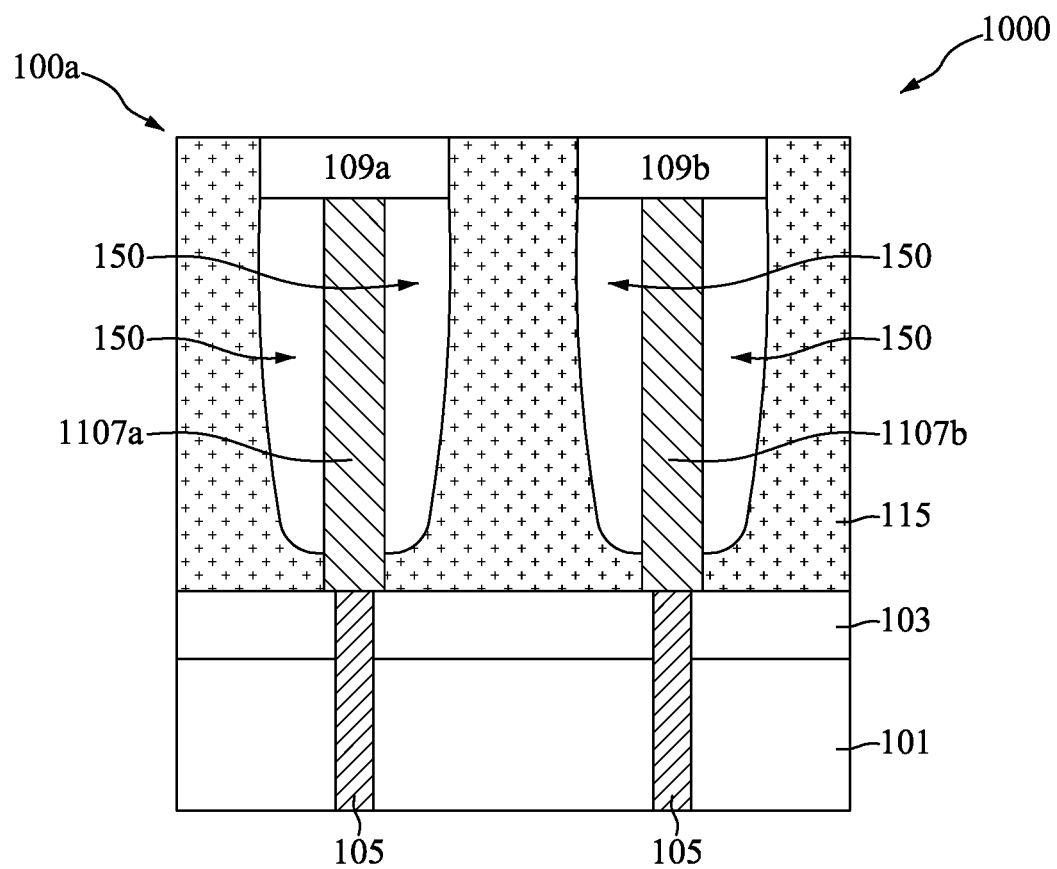

Referring to FIG. 8, the method 10 at step S19 may further proceed to form an inter-layer dielectric (ILD) layer 115 covering sidewalls of the dielectric structures 109a and 109b. Because the width W1 of the dielectric structure 109a (referring to FIG. 7) is greater than the width W4 of the remaining portion of the conductive structure 1107a, the ILD layer 115 is formed with air spacers 150 enclosed between the dielectric structure 109a, the remaining portion of the conductive structure 1107a and the ILD layer 115. Similarly, the dielectric structure 109b, the remaining portion of the conductive structure 1107b and the ILD layer 115 have air spacers 150 enclosed between them.

It should be noted that the lower sidewalls of the remaining portions of the conductive structures 1107a and 1107b are in direct contact with the ILD layer 115, such that the bottom surfaces of the air spacers 150 are higher than the bottom surfaces of the remaining portions of the conductive structures 1107a and 1107b. In some embodiments, the ILD layer 115 is formed in the opening 210 and the enlarged opening 1310, the opening 210 is entirely filled by the ILD layer 115, and the enlarged opening 1310 is partially filled by the ILD layer 115. More specifically, the widths of each of the air spacers 150 gradually decrease along a direction from the dielectric structures 109a and 109b to the substrate 101, in accordance with some embodiments.

In addition, the ILD layer 115 is formed by a deposition process, such as a CVD process, a flowable CVD (FCVD) process, an HDPCVD process, an ALD process, a spin-coating process, another applicable process, or a combination thereof. In some embodiments, the ILD layer 115 is made of silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), and polyimide.

After the deposition process for forming the ILD layer 115 is performed, a planarization process may be performed to remove a portion of the ILD layer 115 and portions of the dielectric structures 109a and 109b, in order to correct deficiencies formed in the dielectric structures 109a and 109b during the previous etching processes.

Figure 9:
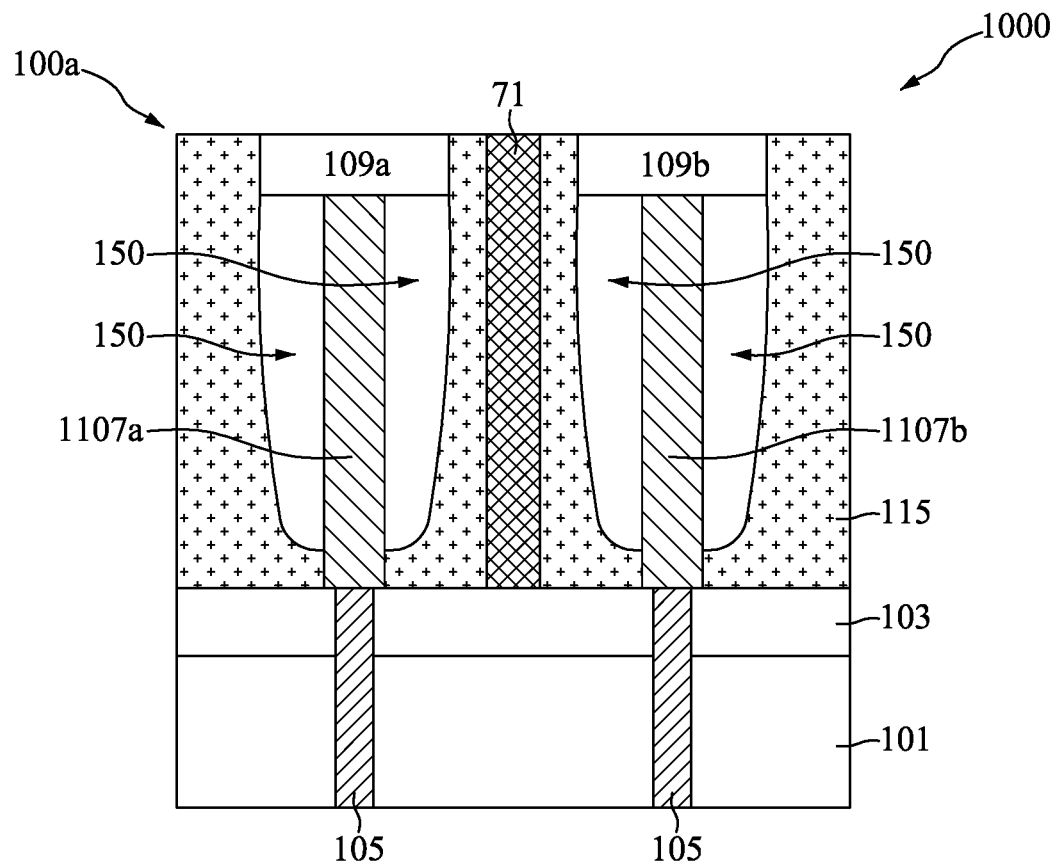

Referring to FIG. 9, the method 10 at step S21 performs fabrication processes to form a reinforcement pillar 71 of energy removable material in the ILD layer 115. In some embodiments, the step S21 includes forming an opening (not shown in the drawings) in the ILD layer 115 by lithographic and etching processes, and the energy removable material 71 is formed to fill the opening.

Figure 10:
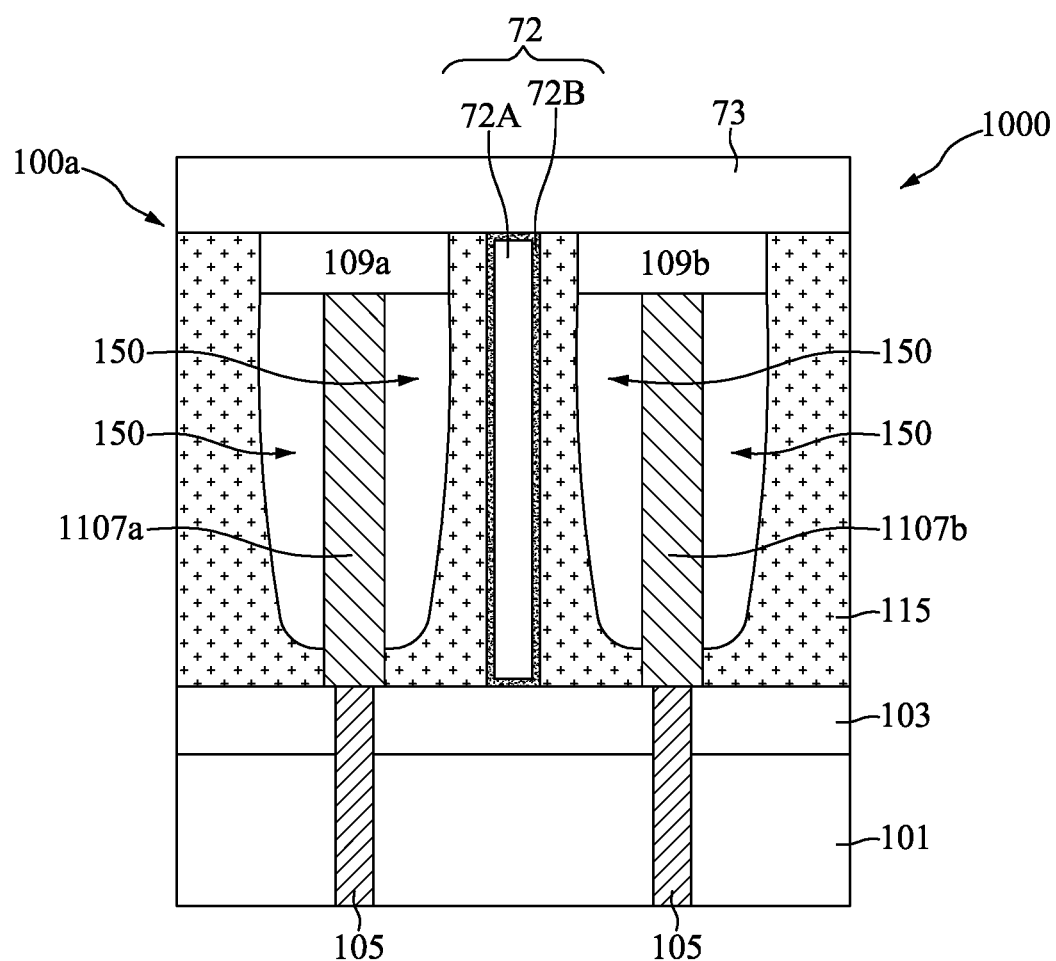

Referring to FIG. 10, the method 10 at step S23 forms a capping dielectric layer 73 over the reinforcement pillar 71, and the method 10 at step S25 transforms the reinforcement pillar 72 into a dielectric isolation structure 72 including a liner layer 72B enclosing an air gap 72A. After the transformation process of the reinforcement pillar 71 into the dielectric isolation structure 72, an integrated circuit structure 100a is obtained. In some embodiments, the energy removable material 71 include a thermal decomposable material. In some other embodiments, the energy removable material 71 include a photonic decomposable material, an e-beam decomposable material, or another applicable energy decomposable material. In some embodiments, the materials of the energy removable material include a base material and a decomposable porogen material that is substantially removed once being exposed to an energy source (e.g., heat).

In some embodiments, the base material includes hydrogen silsesquioxane (HSQ), methylsilsesquioxane (MSQ), porous polyarylether (PAE), porous SiLK, or porous silicon oxide (SiO2), and the decomposable porogen material includes a porogen organic compound, which can provide porosity to the space originally occupied by the energy removable layer in the subsequent processes.

Figure 11:
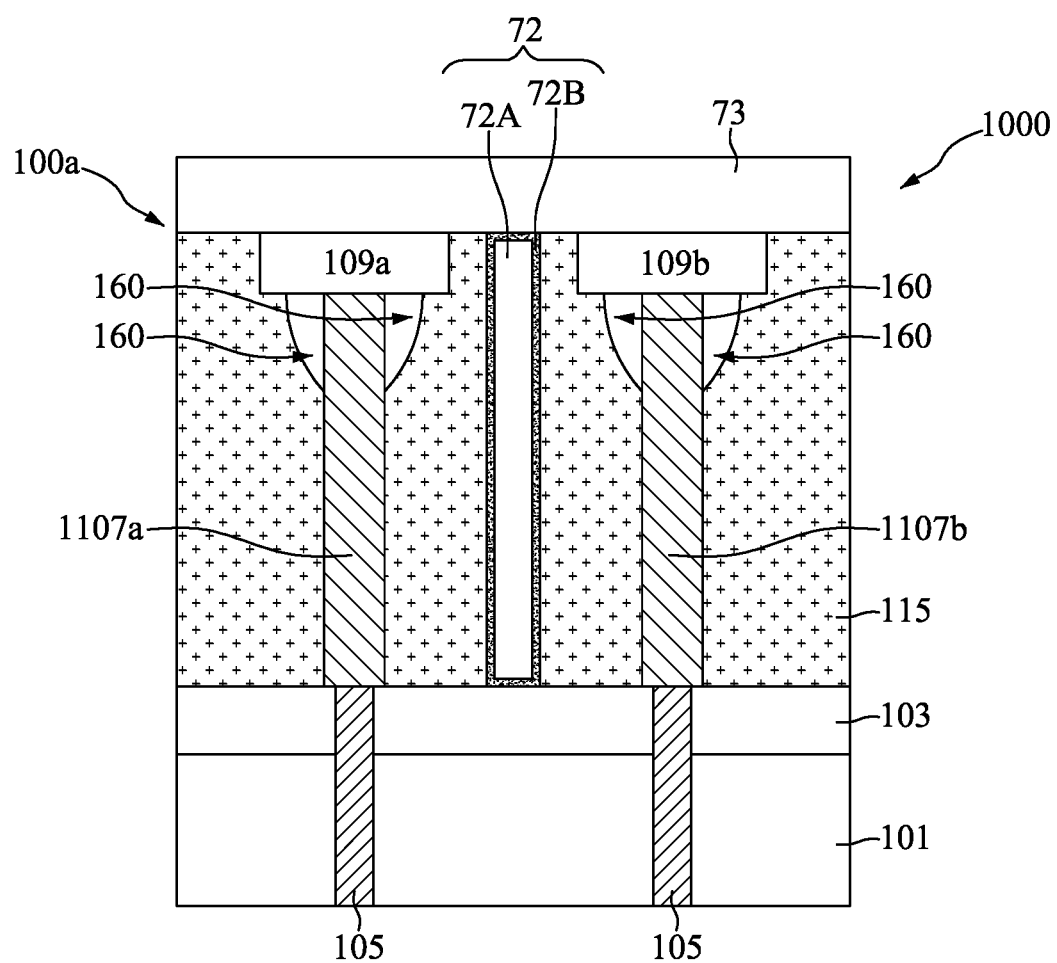
FIG. 11 is a schematic cross-sectional view of an integrated circuit structure in accordance with some embodiments of the present disclosure.

FIG. 11 is a schematic cross-sectional view of an integrated circuit structure 100b in accordance with some embodiments of the present disclosure. The integrated circuit structure 100b is similar to the integrated circuit structure 100a of FIG. 10, except for differences in profiles of the air spacers.

As shown in FIG. 11, the ILD layer 115 is in direct contact with the bottom surfaces of the dielectric structures 109a and 109b, and the occupied area of each of the air spacers 160 of the integrated circuit structure 100b is less than the occupied area of each of the air spacers 150 of the integrated circuit structure 100a. It should be noted that the profiles of the air spacers 160 may be obtained when a material of the ILD layer 115 is selected to have a better step coverage (e.g., a step coverage better than that of the material of the ILD layer 115 in FIG. 8).

Embodiments of an integrated circuit structure and method for forming the same are provided. The method for forming the integrated circuit structure (e.g., integrated circuit structures 100a, 100b and 100c) includes transforming sidewall portions of the conductive structures 107a, 107b into dielectric portions (e.g., dielectric portions 113a, 113b, 213a and 213b) by performing one or multiple repetitions of heat treatment processes and removing the above-mentioned dielectric portions such that the width of each of the dielectric structures (e.g., dielectric structures 109a and 109b) is greater than the width of each of the remaining portions of the conductive structures (e.g., remaining portions of the conductive structures 107a', 107b', 107a", 107b", 1107a and 1107b). As a result, after the ILD layer 115 is formed covering sidewalls of the dielectric structures, air spacers (e.g., air spacers 150, 160 and 170) are formed between the ILD layer 115 and the remaining portions of the conductive structures.

The formation of the air spacers over the sidewalls of the conductive features and the dielectric isolation structure between the conductive features aids in the prevention of crosstalk (i.e., signal interference) between adjacent conductive structures, and the performance of the integrated circuit structures may be improved. Moreover, because the ILD layer is formed over opposite sidewalls of the conductive structures after the conductive structures are formed, a pinch-off problem near the top of the conductive structures and creation of voids or seams in the conductive structures can be prevented. In addition, the method also includes transforms a reinforcement pillar into a dielectric isolation structure including a liner layer enclosing an air gap, which can reduce capacitive coupling and crosstalk between conductive features.

In some embodiments of the present disclosure, a method for preparing an integrated circuit structure is provided. The method for preparing an integrated circuit structure, comprises: forming a first conductive structure over a substrate; forming a first dielectric structure over the first conductive structure; transforming a sidewall portion of the first conductive structure into a first dielectric portion; removing the first dielectric portion such that a width of the first dielectric structure is greater than a width of a remaining portion of the first conductive structure; forming an inter-layer dielectric (ILD) layer covering a sidewall of the first dielectric structure; forming a reinforcement pillar of energy removable material in the ILD layer; forming a capping dielectric layer over the reinforcement pillar; and performing a thermal process to transform the reinforcement pillar into a dielectric isolation structure including a liner layer enclosing an air gap.

In some embodiments of the present disclosure, a method for preparing an integrated circuit structure is provided. The method for preparing an integrated circuit structure, comprises: forming a conductive layer over a substrate; forming a dielectric layer over the conductive layer; patterning the dielectric layer and the conductive layer to form a first dielectric structure, a second dielectric structure, a first conductive structure and a second conductive structure, wherein a first opening is formed between the first dielectric structure and the second dielectric structure, and a second opening is formed between the first conductive structure and the second conductive structure; partially removing the first conductive structure and the second conductive structure to form an enlarged second opening; forming an inter-layer dielectric (ILD) layer covering sidewalls of the first dielectric structure and the second dielectric structure; forming a reinforcement pillar of energy removable material in the ILD layer; forming a capping dielectric layer over the reinforcement pillar; and performing a thermal process to transform the reinforcement pillar into a dielectric isolation structure including a liner layer enclosing an air gap.

In some embodiments of the present disclosure, an integrated circuit structure is provided. The integrated circuit structure comprises: a plurality of conductive structures disposed over a substrate; a plurality of dielectric structures disposed over the conductive structures; an inter-layer dielectric (ILD) layer disposed over sidewalls of the dielectric structures and sidewalls of the conductive structures, wherein the ILD layer, the dielectric structure and the conductive structure form an air spacer therebetween; and a dielectric isolation structure including a liner layer enclosing an air gap in the ILD layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. An integrated circuit structure, comprising:
a plurality of conductive structures disposed over a substrate;
a plurality of dielectric structures disposed over the conductive structures;
an inter-layer dielectric (ILD) layer disposed over sidewalls of the dielectric structures and sidewalls of the conductive structures, wherein the ILD layer, the dielectric structure and the conductive structure form an air spacer therebetween;
a reinforcement pillar, which is made of energy removable material, formed in the ILD layer;
a capping dielectric layer formed over the reinforcement pillar; and
a dielectric isolation structure, which is transformed by the reinforcement pillar, including a liner layer enclosing an air gap in the ILD layer.

2. The integrated circuit structure of claim 1, wherein a width of the air spacer gradually decreases along a direction from the dielectric structures to the substrate, such that the width of the air spacer toward the dielectric structure is larger than the width of the air spacer toward the substrate.

3. The integrated circuit structure of claim 1, wherein a lower portion of the sidewall of the conductive structure is in direct contact with the ILD layer, wherein each of the conductive structures has a dielectric portion and a remaining portion, wherein the dielectric portion of the conductive structure is removed from the remaining portion thereof to form the air space between the remaining portion of the conductive structure and the ILD layer, wherein a width of the dielectric structure is greater than a width of the remaining portion of the first conductive structure.

4. The integrated circuit structure of claim 1, wherein the conductive structure and the air spacer are entirely covered by the dielectric structure, and a portion of a bottom surface of the dielectric structure is in direct contact with the ILD layer.

5. The integrated circuit structure of claim 1, wherein a bottom surface of the first air spacer is higher than a bottom surface of the conductive structures.

6. The method for preparing an integrated circuit structure of claim 1, wherein the ILD layer extends over and makes direct contact with a lower sidewall of the conductive structures, wherein the reinforcement pillar is in the ILD layer between the conductive structures.

* * * * *